US006706630B1

(12) United States Patent
Marathe

(10) Patent No.: US 6,706,630 B1
(45) Date of Patent: Mar. 16, 2004

(54) METHOD FOR FORMING AN ALLOYED METAL CONDUCTIVE ELEMENT OF AN INTEGRATED CIRCUIT

(75) Inventor: Amit P. Marathe, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/376,399

(22) Filed: Feb. 28, 2003

(51) Int. Cl.[7] .............................................. H01L 21/44
(52) U.S. Cl. ....................................... 438/687; 438/624
(58) Field of Search ................................. 438/687, 633, 438/624, 677, 694, 788, 760–761, 678, 638, 648, 656, 660, 685

(56) References Cited

U.S. PATENT DOCUMENTS 6,043,149 A * 3/2000 Jun ............................ 438/658
6,147,000 A * 11/2000 You et al. .................... 438/687
6,455,425 B1 * 9/2002 Besser et al. ................ 438/687

* cited by examiner

Primary Examiner—David Nelms
Assistant Examiner—David Vu
(74) Attorney, Agent, or Firm—Foley & Lardner

(57) ABSTRACT

The introduction of alloying elements into a metal conductive element is achieved in situ in conjunction with a post-CMP reducing treatment. The source of the alloying elements may be a source gas introduced into the plasma chamber, or a source material incorporated into a post-CMP residue through presence in a CMP slurry or a post-CMP rinsing agent, or applied to the substrate prior to plasma treatment. The alloying element is introduced into the metal conductive element by diffusion during plasma treatment.

12 Claims, 5 Drawing Sheets

METHOD FOR FORMING AN ALLOYED METAL CONDUCTIVE ELEMENT OF AN INTEGRATED CIRCUIT

BACKGROUND OF THE INVENTION

1. Field of the Invention

Preferred embodiments of the invention pertain to the prevention of electromigration in metal wiring elements of an integrated circuit.

2. Background Technology

Integrated circuits (ICs) are manufactured by forming discrete semiconductor devices such as MOSFETS and bipolar junction transistors on a semiconductor substrate, and then forming a back end metal wiring network that connects those devices to create circuits. The wiring network is composed of individual metal wires called interconnects that generally lay parallel to the plane of the substrate. Interconnects are connected to the semiconductor devices by vertical contacts and are connected to other interconnects by vertical vias. A typical wiring network employs multiple levels of interconnects and vias.

The performance of integrated circuits is determined in large part by the conductivity and capacitance of the wiring network. Copper (Cu) has been adopted as the preferred metal for wiring networks because of its low resistivity compared to other conventional metals such as tungsten (W) and aluminum (Al), and because of its low cost compared to other low resistivity metals such as silver (Ag) and gold (Au). High quality Cu is also easily formed by damascene (inlay) processing using wet plating techniques such as electroplating or electroless plating followed by annealing.

Although Cu provides the aforementioned desirable features, it also has detrimental characteristics that must be addressed in order to produce functional products. One problem with Cu is its tendency to diffuse into surrounding semiconductor and insulating substrate materials. This diffusion degrades the semiconductive or insulative properties the surrounding material, and also affects the adhesion of the copper to the substrate. As a result, it is now conventional to provide a diffusion barrier between the copper and surrounding material. Conventional Cu diffusion barrier materials include titanium (Ti), W, chromium (Cr), tantalum (Ta), and tantalum nitride (TaN).

Another detrimental characteristic of Cu wiring is its susceptibility to oxidation. Cu is typically oxidized by strong chemical oxidizing agents that are conventionally included in the chemical mechanical polishing (CMP) slurries typically employed in damascene processing, and by exposure to the ambient atmosphere following CMP. Cu oxide layers are brittle and increase the risk of circuit disconnect or reduced conductivity. Cu oxide also increases the contact resistance in connections made with other conductive elements. The conventional technique for eliminating Cu oxide involves plasma treatment of the Cu surface using a reducing agent such as ammonia ($NH_3$), followed by in situ deposition (i.e. deposition performed prior to removing the substrate from the deposition chamber) of a layer of a protective material such as silicon nitride (SiN) or a selectively deposited protective metal layer.

Another detrimental characteristic of Cu is its susceptibility to electromigration. Electromigration is the physical transport of Cu atoms and ions in the direction of current flow within the Cu conductor as the result of momentum transfer caused by collisions with flowing electrons. The current flow also creates a thermal gradient along the conductor that increases the mobility of the Cu atoms and ions. Electromigration can produce thinning of the Cu conductor and eventual separation to form an open circuit, resulting in circuit failure. Electromigration is pronounced in the vicinity of Cu oxide. One approach to reducing electromigration is doping of the Cu with an alloying element that inhibits electromigration. Some alloying elements have also been found to reduce Cu diffusion.

FIGS. 1a–1h show structures at successive stages in the formation of an alloyed copper conductive element of an integrated circuit in accordance with conventional processing. FIG. 1a shows a typical intermediate structure formed during copper damascene processing. The structure includes a substrate comprising a layer of an interlevel insulating material 10. A conductive via 12 is inlaid in the substrate. A trench 16 is formed in the substrate 10 to expose the via 12, and a layer of a barrier material 14 covers the substrate.

FIG. 1b shows the structure of FIG. 1a after formation of a conformal alloy layer 18 over the barrier layer 14 by physical vapor deposition or "sputtering." The alloy layer 18 comprises an alloying element for preventing electromigration of Cu.

FIG. 1c shows the structure of FIG. 1b after formation of a conformal layer of copper 20 over the substrate to fill the trench. The copper layer 20 is formed by electroplating or electroless plating.

FIG. 1d shows the structure of FIG. 1c during annealing. The elevated temperatures used during annealing to improve the crystalline structure of the copper also cause diffusion of the alloying element from the alloy layer 18 into the copper layer 20 as indicated by the arrows. The degree of diffusion is determined by the time and temperature of the anneal.

FIG. 1e shows the structure of FIG. 1d during CMP. CMP is performed by rotating the substrate and applying a rotating polishing disc 22 to the rotating substrate. A chemical mechanical slurry 24 comprising abrasive elements and oxidizing elements is provided between the substrate and the polishing disc. After the overburden is removed, the substrate is treated with a post-CMP rinsing agent to remove the CMP slurry.

FIG. 1f shows the structure of FIG. 1e after completion of chemical mechanical polishing. The copper layer above the substrate is polished away, leaving an alloyed copper conductive element 26 inlaid in the substrate. A polishing residue 28 remains on the surface of the substrate. The residue 28 is typically a mixture of the CMP slurry and the post-CMP rinsing agent. An oxide cap 30 is formed on the copper conductive element 26 as the result of exposure to the CMP slurry, the rinsing agent, and atmospheric oxygen.

FIG. 1g shows the structure of FIG. 1f during plasma treatment. The substrate is exposed to a reducing plasma such as ammonia ($NH_3$) at a temperature of 300–400 degrees C and a voltage of 50 to 200 volts for a time of about 5 to 200 seconds. The reducing plasma removes the Cu oxide cap and also removes any remaining CMP residue.

FIG. 1h shows the structure of FIG. 1g after in situ deposition of a cap layer such as SiN or selectively deposited metal. The cap layer protects the copper conductive element 26 and prevents diffusion from the surface of the copper conductive element 26.

The processing shown in FIGS. 1a–1h differs from conventional copper damascene processing in that it includes the additional processing step shown in FIG. 1b for forming the alloying layer 18. However, this additional processing step increases the time, cost and complexity of the fabrication process. Further, this manner of alloying tends to produce non-uniform alloy densities in trenches of different widths because the proportion of the trench that is filled by the alloy layer increases as the width of the trench decreases.

SUMMARY OF THE INVENTION

In accordance with embodiments of the invention, the introduction of alloying elements into a metal conductive element is performed in situ in conjunction with conventional post-CMP reducing treatment of conventional copper damascene processing. The source of the alloying elements in preferred embodiments may be a source gas introduced into the plasma chamber. Alternatively, the source of the alloying elements may be a CMP residue comprising a CMP slurry or a post-CMP rinse that includes an alloying element. By controlling the time, temperature and pressure of the plasma treatment, diffusion of the alloying element into the metal conductive element is promoted, eliminating the need for a separate alloy layer deposition step. This provides alloying without adding substantially increasing processing complexity, and provides uniform alloy density.

In accordance with one embodiment of the invention, a substrate is provided. The substrate includes a trench in which a conductive element such as an interconnect, contact or via is to be inlaid. The substrate typically comprises a layer of an interlevel insulating material in which the trench is formed, but may comprise a variety of additional layers and structures. A metal layer is then formed over the substrate to fill the trench. After the metal layer is formed, an overburden portion of the metal layer is removed to leave a metal conductive element inlaid in the trench. A CMP slurry used to remove the overburden portion may include one or more materials that are sources of one or more alloying elements to be diffused into the metal. When all overburden material has been removed, the slurry is cleansed from the substrate with a post-CMP rinsing agent. The rinsing agent may include one or more materials that are sources of one or more alloying elements to be diffused into the metal. After the overburden is removed, one or more alloying elements are diffused into the metal conductive element in situ in conjunction with reducing plasma treatment of the exposed surface of the metal conductive element. A source of the one or more alloying elements may be source gasses introduced into the chamber. Depending on the source gas, the alloying element or elements may be introduced concurrently with the reducing gas, or may be introduced separately from the reducing gas. Another source of the one or more alloying elements may be a post-CMP residue that remains on the substrate after CMP processing. The source materials may be incorporated into a CMP slurry or a post-CMP rinsing agent.

DESCRIPTION OF THE DRAWINGS

Preferred embodiments will hereafter be described with reference to the accompanying drawings, wherein like numerals denote like elements, and in which.

DETAILED DESCRIPTION OF PREFERRED EMBODIMENTS

First Preferred Embodiment

Figure 2:
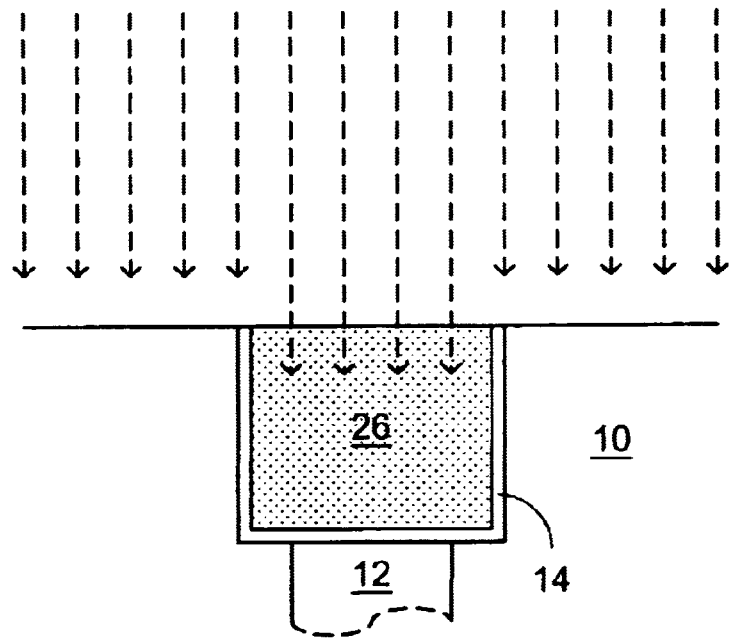
FIG. 2 shows a processing task in which an alloying element is introduced into a copper conductive element in accordance with a first preferred embodiment.

FIG. 2 shows plasma pretreatment processing in accordance with a first preferred embodiment. In the conventional process, a reducing plasma treatment is used to remove oxidation from the copper conductive element prior to formation of a protective layer. In accordance with the preferred embodiment, the reducing plasma treatment is accompanied in situ by treatment with a plasma produced from a source gas that contains an alloying element. Typically the reducing plasma treatment is performed first, followed by treatment with the alloy-containing plasma. However, in some instances the reducing plasma may include the alloying element. Preferred alloying elements are those that have low solid solubility in Cu such that they have a high potential to be rejected from the Cu lattice and segregate at the Cu grain boundaries. This lowers the final Cu-alloy resistivity and provides more effective resistance to Cu diffusion along the grain boundaries. Preferred alloying elements include Sn, In, Zr, Ca, Al, Zn, Cr and La, however other alloying elements may also be employed.

Second Preferred Embodiment

Figure 3:
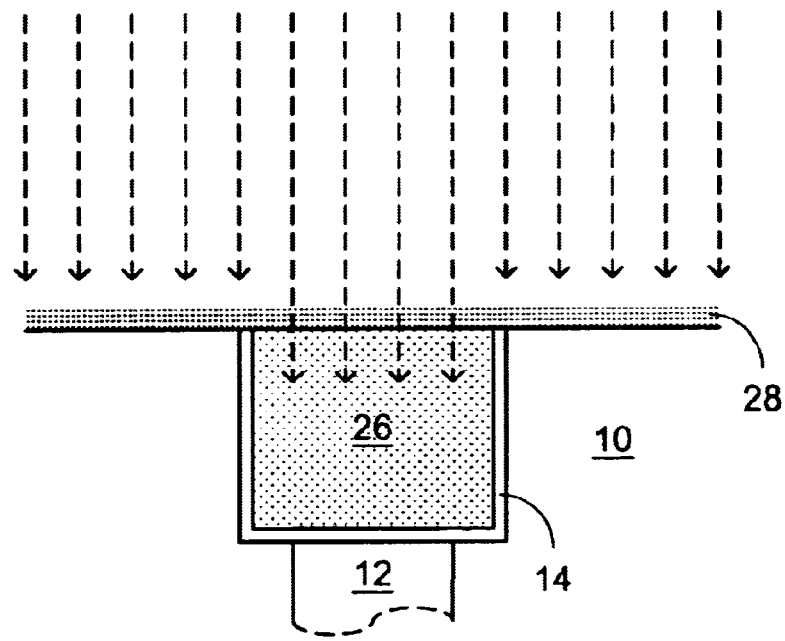
FIG. 3 shows a processing task in which an alloying element is introduced into a copper conductive element in accordance with a second preferred embodiment.

FIG. 3 shows a plasma treatment in accordance with a second preferred embodiment. In the conventional damascene process, the reducing plasma treatment removes CMP residue that includes CMP slurry or post-CMP rinsing agent. In accordance with the preferred embodiment, the presence of this residue is used advantageously as a source of alloying element. The alloying element in the residue 28 is caused to diffuse into the copper conductive element 26 during the plasma treatment.

In accordance with this embodiment, multiple source materials may be utilized to provide multiple alloying elements.

Third Preferred Embodiment

In a third preferred embodiment, alloying element source materials may be directly applied to the substrate prior to reducing plasma treatment, rather than incorporating those materials into a CMP slurry or post-CMP rinsing agent.

Fourth Preferred Embodiment

In a fourth preferred embodiment, various combinations of source gasses, post-CMP residue components containing source materials, and directly applied source materials may be used concurrently as sources of alloying elements.

Process Flow

Figure 4:
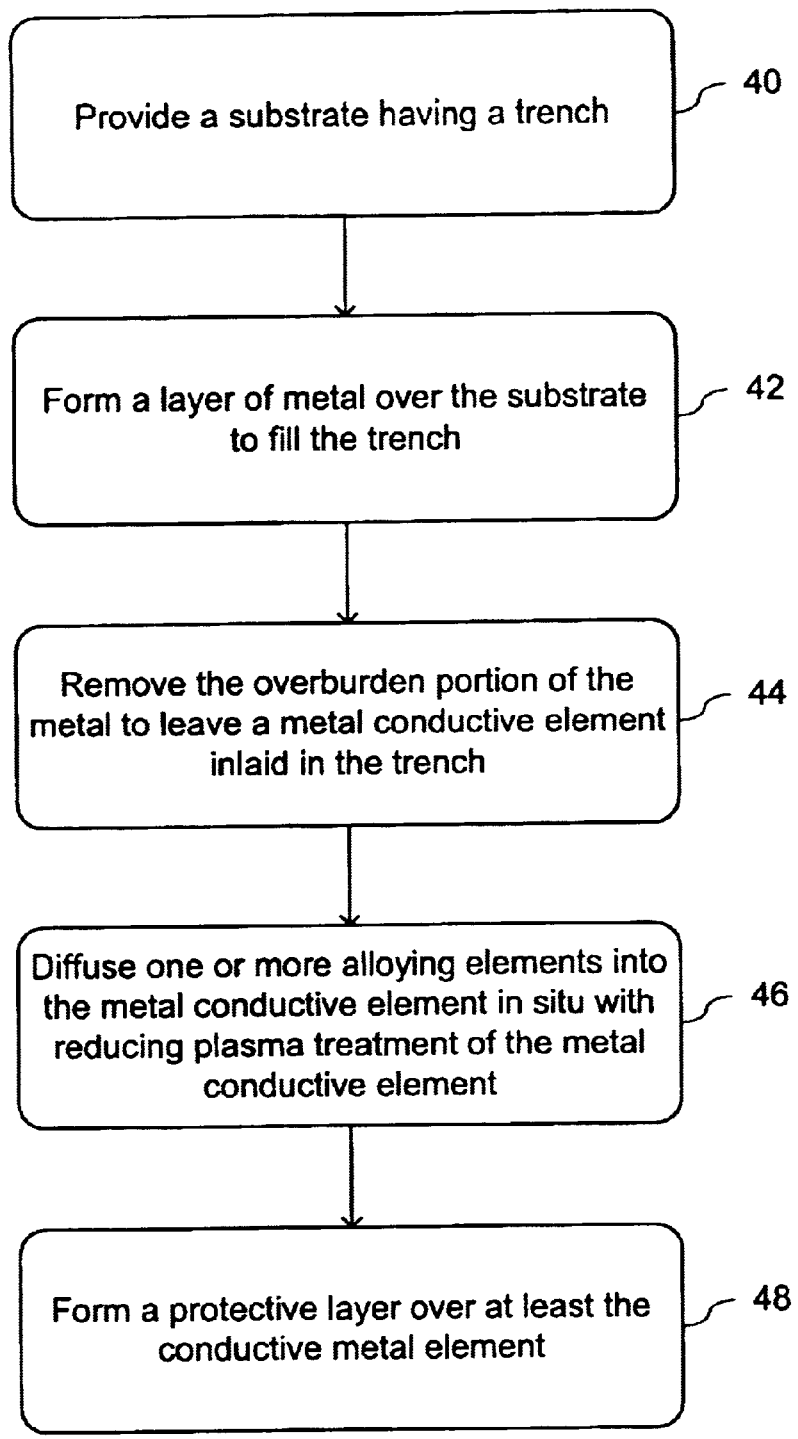
FIG. 4 shows a basic process flow encompassing the preferred embodiments and other alternative embodiments.

FIG. 4 shows a basic process flow that encompasses the aforementioned preferred embodiments and alternative embodiments.

Figure 1A:
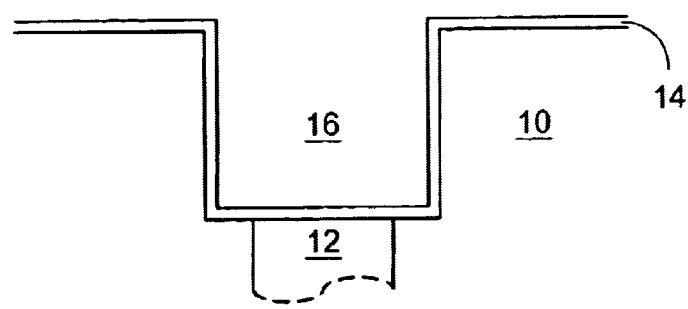
FIGS. 1a–1h show structures formed during conventional processing to produce an alloyed copper conductive element.
Figure 1B:
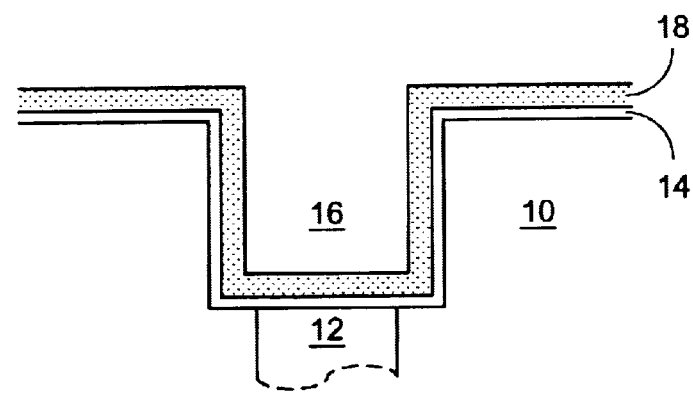
Figure 1C:
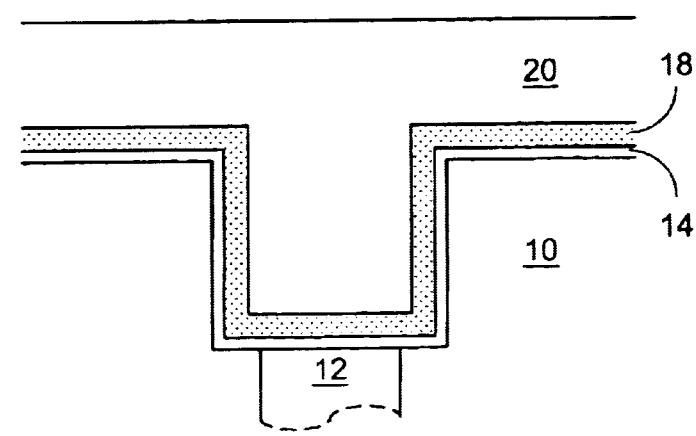
Figure 1D:
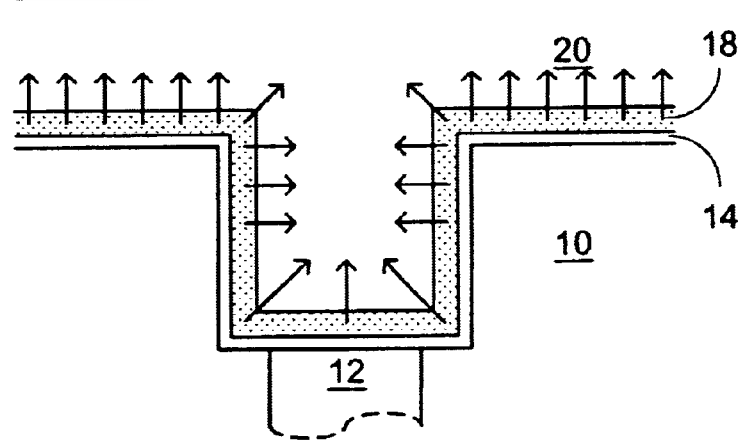
Figure 1E:
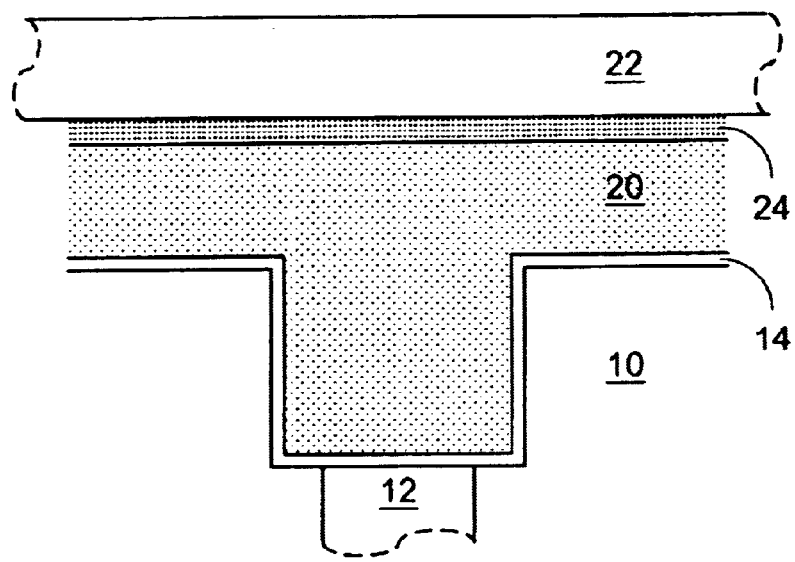
Figure 1F:
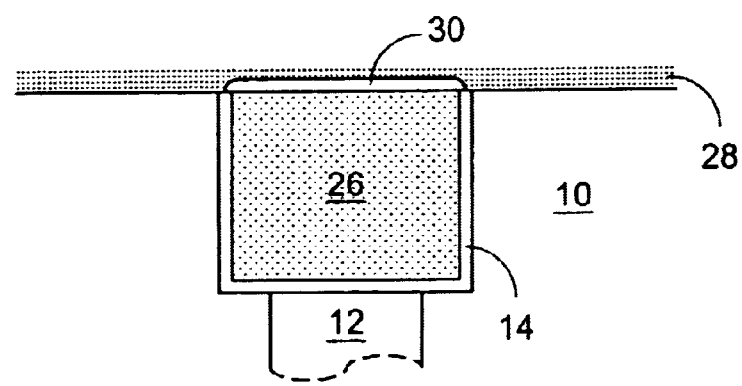
Figure 1G:
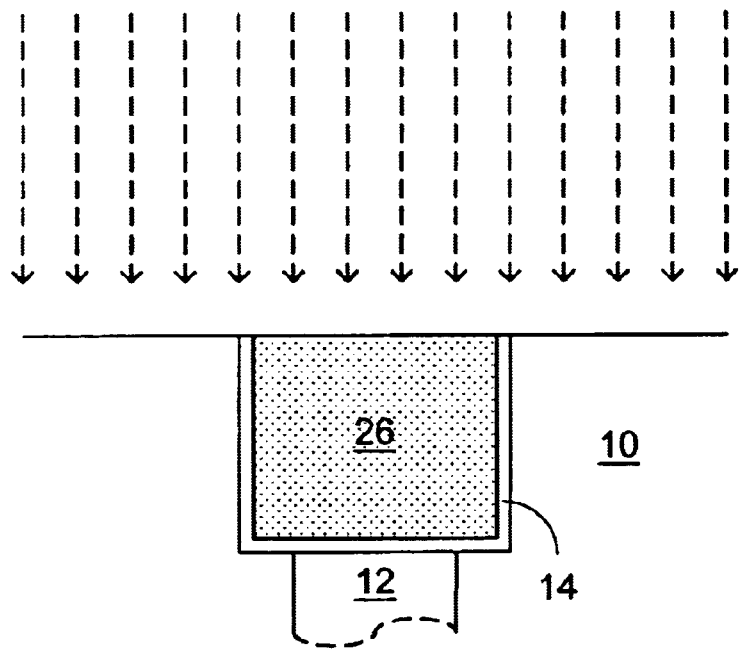
Figure 1H:
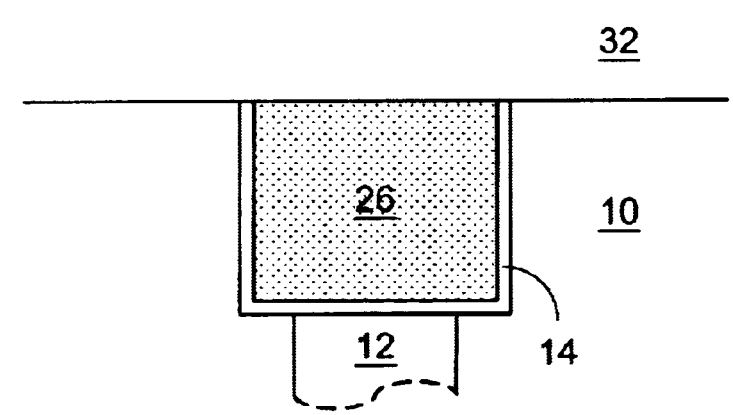

Initially a substrate is provided (40). The substrate includes a trench in which a conductive element such as an interconnect, contact or via is to be inlaid. The substrate typically comprises a layer of an interlevel insulating material in which the trench is formed. However, the substrate may comprise a variety of additional layers and structures, examples of which are well known to those of skill in the art. The trench, and optionally the entire substrate, may further comprise an upper conformal layer of a barrier material, such as is shown in FIG. 1a.

A metal layer is formed over the substrate to fill the trench (42). The metal is preferably copper. The metal layer may be formed by any of a variety of well-known techniques such as sputtering or plating by electroplating or electroless plating. Where a plating technique is used, the plating process is typically preceded by formation of a seed layer through a process such as sputtering.

After the metal layer is formed, an overburden portion of the metal layer (i.e. the portion of the metal layer that is not within the trench) is removed to leave a metal conductive element inlaid in the trench (44). Where a conformal barrier layer has been deposited, an overburden portion of the barrier layer may also be removed. The overburden portions are typically removed by CMP. In accordance with one preferred embodiment, the CMP slurry may include one or more materials that are sources of one or more alloying elements to be diffused into the metal. When all overburden material has been removed, the slurry is cleansed from the substrate with a post-CMP rinsing agent. The rinsing agent may include one or more materials that are sources of one or more alloying elements to be diffused into the metal.

After the overburden is removed, one or more alloying elements are diffused into the metal conductive element in situ with reducing plasma treatment of the exposed surface of the metal conductive element (46). A source of the one or more alloying elements may be source gasses introduced into the chamber. Depending on the source gas, the alloying element or elements may be introduced concurrently with the reducing gas, or may be introduced separately from the reducing gas. Another source of the one or more alloying elements may be a post-CMP residue that remains on the substrate after CMP processing. The source materials may be incorporated into a CMP slurry or a post-CMP rinsing agent. Thus the alloying elements may be provided through any combination of source gasses, source materials incorporated into the CMP slurry, and source materials incorporated into the post-CMP rinsing agent.

After diffusion of alloying elements, a protective layer is formed over at least the metal conductive element (48). The protective layer may cover both the metal conductive element and the surrounding substrate, such as is typical with a conventional PECVD SiN protective layer. Alternatively, the protective layer may cover primarily the metal conductive element, such as is typical with protective metal layers deposited through selective deposition techniques.

It will be apparent to those having ordinary skill in the art that the tasks described in the above processes are not necessarily exclusive of other tasks, but rather that further tasks may be incorporated into the above processes in accordance with the particular structures to be formed. For example, the layer of metal formed over the substrate may include alloying elements, or a conformal alloying layer may be formed prior to formation of the metal layer, such that the alloying processes specifically described herein are complementary to such other alloying methods. Additionally, the alloying elements used may be chosen to provide properties other than electromigration improvement, such as diffusion resistance or improved adhesion. Also, intermediate processing tasks such as formation and removal of passivation layers or protective layers between processing tasks, formation and removal of photoresist masks and other masking layers, doping and counter-doping, cleaning, planarization, and other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A method for forming a conductive element of an integrated circuit, comprising:

providing a substrate having a trench formed therein;

forming a layer of metal over the substrate to fill the trench;

removing an overburden portion of the metal layer by chemical-mechanical polishing (CMP) to leave a metal conductive element inlaid in the trench;

diffusing at least one alloying element into the metal conductive element in situ with reducing plasma treatment of the metal conductive element; and forming a protective layer on at least an exposed surface of the metal conductive element.

2. The method claimed in claim 1, wherein at least one of said at least one alloying elements is provided in a source material incorporated into a CMP residue remaining on the substrate after CMP.

3. The method claimed in claim 2, wherein the source material is incorporated into a CMP slurry.

4. The method claimed in claim 2, wherein the source material is incorporated into a post-CMP rinsing agent.

5. The method claimed in claim 1, wherein at least one of said at least one alloying elements is provided in a source gas introduced into the plasma treatment chamber.

6. The method claimed in claim 1, wherein the source gas is introduced into the plasma treatment chamber concurrently with a reducing gas for performing said reducing treatment.

7. The method claimed in claim 1, wherein the source gas is introduced into the plasma treatment chamber separately from a reducing gas for performing said reducing treatment.

8. The method claimed in claim 1, wherein at least one of said at least one alloying elements is provided in a source material incorporated into a CMP residue remaining on the substrate after CMP, and wherein at least one of said at least one alloying elements is provided in a source gas introduced into the plasma treatment chamber.

9. The method claimed in claim 1, wherein at least one of said at least one alloying elements is provided in a source material applied to the substrate prior to reducing plasma treatment.

10. The method claimed in claim 1, wherein said metal is copper.

11. The method claimed in claim 10, wherein said at least one alloying element comprises an alloying element for improving electromigration properties of the copper.

12. A method for forming a conductive element of an integrated circuit, comprising:

providing a substrate having a trench formed therein;

forming a barrier layer in the trench;

forming a layer of copper over the substrate to fill the trench;

removing an overburden portion of the copper by chemical-mechanical polishing (CMP) to leave a copper conductive element inlaid in the trench;

diffusing at least one alloying element into the copper conductive element in situ with reducing plasma treatment of the copper conductive element, the at least one alloying element producing an improvement in electromigration of the copper conductive element; and forming a protective layer on at least an exposed surface of the metal conductive element, wherein the at least one alloying element is supplied by at least one of a CMP slurry, a post-CMP rinsing agent, a source gas introduced during said reducing plasma treatment, and a source gas introduced after said reducing plasma treatment.

* * * * *